(12) United States Patent
Browne et al.

(10) Patent No.: US 7,538,472 B2
(45) Date of Patent: May 26, 2009

(54) PROGRAMMABLE SHIMS FOR MANUFACTURING AND ASSEMBLY LINES

(75) Inventors: Alan L. Browne, Grosse Pointe, MI (US); Charles W. Wampler, II, Birmingham, MI (US); Andrew C. Keefe, Santa Monica, CA (US); Nancy L. Johnson, Northville, MI (US); John A. Cafeo, Farmington, MI (US); Gary L. Jones, Farmington Hills, MI (US); William Barvosa-Carter, Ventura, CA (US); Nilesh D. Mankame, Sterling Heights, MI (US)

(73) Assignee: Gm Global Technology Operations, Inc., Detroit, MI (US)

( * ) Notice: Subject to any disclaimer, the term of this patent is extended or adjusted under 35 U.S.C. 154(b) by 334 days.

(21) Appl. No.: 11/078,693

(22) Filed: Mar. 11, 2005

(65) Prior Publication Data
US 2005/0200067 A1    Sep. 15, 2005

Related U.S. Application Data

(60) Provisional application No. 60/552,970, filed on Mar. 12, 2004.

(51) Int. Cl.
*H01L 41/08* (2006.01)

(52) U.S. Cl. .................................. 310/311; 310/328

(58) Field of Classification Search ................. 310/328, 310/330–332
See application file for complete search history.

(56) References Cited

U.S. PATENT DOCUMENTS

| | | | | |
|---|---|---|---|---|
| 3,902,084 | A * | 8/1975 | May, Jr. ....................... | 310/328 |
| 4,798,989 | A * | 1/1989 | Miyazaki et al. ............ | 310/328 |
| 4,928,030 | A * | 5/1990 | Culp ........................... | 310/328 |
| 6,359,370 | B1 * | 3/2002 | Chang ......................... | 310/328 |
| 6,459,088 | B1 * | 10/2002 | Yasuda et al. .......... | 250/442.11 |
| 6,545,384 | B1 * | 4/2003 | Pelrine et al. ............... | 310/309 |
| 6,979,389 | B2 * | 12/2005 | Hao et al. .............. | 204/192.33 |

OTHER PUBLICATIONS

International Search Report for PCT/US05/08088 dated Jan. 8, 2007 corresponding to this application.

\* cited by examiner

*Primary Examiner*—Mark Budd

(57) ABSTRACT

Disclosed herein is a programmable shim 28 for positioning a work piece 12 comprising a first plate 30; an optional reference frame 32; and an actuator 34 in operative communication with the first plate 30 and the reference frame 32. Disclosed herein too is a method of aligning a work piece 12 comprising disposing the work piece 12 upon a first plate 30 of a programmable shim 28; activating an actuator 34 with an external stimulus; wherein the actuator 34 is in operative communication with the first plate 30; and displacing the work piece 12.

23 Claims, 6 Drawing Sheets

PROGRAMMABLE SHIMS FOR MANUFACTURING AND ASSEMBLY LINES

CROSS-REFERENCE TO RELATED APPLICATIONS

This application claims the benefit of U.S. Provisional Application Ser. No. 60/552,970 filed Mar. 12, 2004, the entire contents of which are hereby incorporated by reference.

BACKGROUND

The present disclosure relates to programmable shims for manufacturing and assembly lines.

The advent of assembly lines has enabled rapid, mass manufacturing of products with a consequent reduction in the cost of manufactured products. Assembly lines generally include multiple operation stages and component, material or sub-assembly inputs. In mass manufacturing, a work piece such as, for example, a door, an engine, a fender, or the like, that is to undergo a series of manufacturing operations is mounted and supported on a transferring device (e.g., pallet, robots, or the like) that is transferred along the assembly line. For purposes of this disclosure it will be assumed that a pallet will be used to transfer the work piece from one station to another during manufacturing. Alternatively, a robot can be used to transfer work pieces during a manufacturing operation. A multitude of operations are performed on the work piece at various stages to produce an end product. A single assembly line can thus be used to assemble varying product types. For example, an assembly line can be configured to assemble a first engine type and then reconfigured to assemble a second, different engine type.

In the mass manufacturing of such automotive structures, it is often desirable to adjust the position of the pallet either prior to or during the manufacturing process to accommodate dimensional variations between successive work pieces. These adjustments are desirable for structures of different types and geometries but are also used to account for dimensional differences in nominally identical parts. If the pallet is not checked and adjusted as desired prior to the manufacturing operation, then the resulting work pieces may lack uniformity and may not be interchangeable. Current methods for adjusting the pallet involve the use of shims having fixed dimensions. A shim is a sheet or slab of metal, wood, plastic, or the like, that is generally used to adjust the position of the work piece by adjusting the pallet upon which the work piece is mounted. The adjustment is generally made by using manual labor, sometimes even in an iterative process, which is both time consuming and expensive. In addition errors during the adjusting process can lead to defective work pieces. It is therefore desirable to have a shim whose geometry can be altered on command, i.e., a programmable shim for adjusting the pallet that is less time consuming and offers ease of operation.

SUMMARY

Disclosed herein is a programmable shim for positioning a work piece comprising a first plate; an optional reference frame; and an actuator in operative communication with the first plate and the reference frame.

Disclosed herein too is a method of aligning a work piece comprising disposing the work piece upon a first plate of a programmable shim; activating an actuator with an external stimulus; wherein the actuator is in operative communication with the first plate; and displacing the work piece.

DETAILED DESCRIPTION OF PREFERRED EMBODIMENTS

Figure 1:
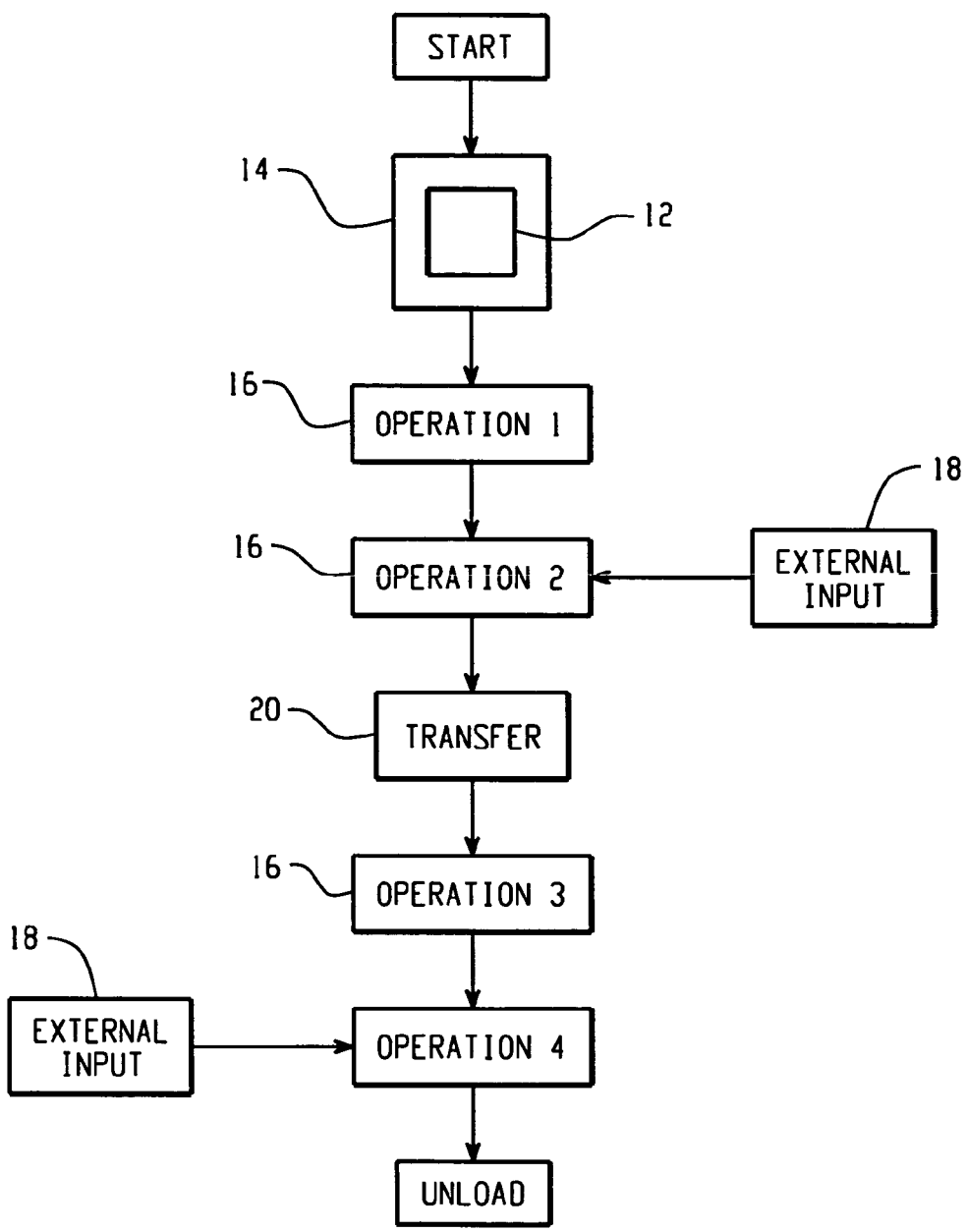
FIG. 1 depicts a scheme for an exemplary assembly line 10.

Referring now to FIG. 1, an exemplary assembly line 10 is schematically illustrated. The assembly line 10 is illustrative of numerous types of assembly lines used across various industries. For example, the assembly line 10 can be used to manufacture automotive components such as, for example, assemble an engine, a chassis, a vehicle sub-assembly or the like. The assembly line 10 can also be used to manufacture non-automotive components. More broadly, the assembly line 10 can depict any type of assembly line across all industries.

A work piece 12 of a "to be assembled" product is moved through the assembly line 10 on a pallet 14. An exemplary work piece is an automotive structure. The generic assembly line 10 includes multiple operation stages 16. Single or multiple operations are performed on the product at each operation stage 16. Such operations include, but are not limited to machining the work piece 12 with equipment such as milling equipment, drilling equipment, or the like, assembling the work piece 12, welding, heat-treating the work piece 12 (e.g., induction hardening), applying sealant, adhesive, or the like, packaging the assembled product for shipping, or the like. Other inputs 18 are also included such as a component input, a sub-assembly input or a material input. A transfer 20 is also provided to transfer the pallets 14 to other parts of the assembly line 10. It is appreciated that the assembly line 10 is merely exemplary in nature and can vary in configuration, the number of operation stages 16, the number and location of component, sub-assembly or material inputs 18, transfers 20, or the like.

Figure 2:
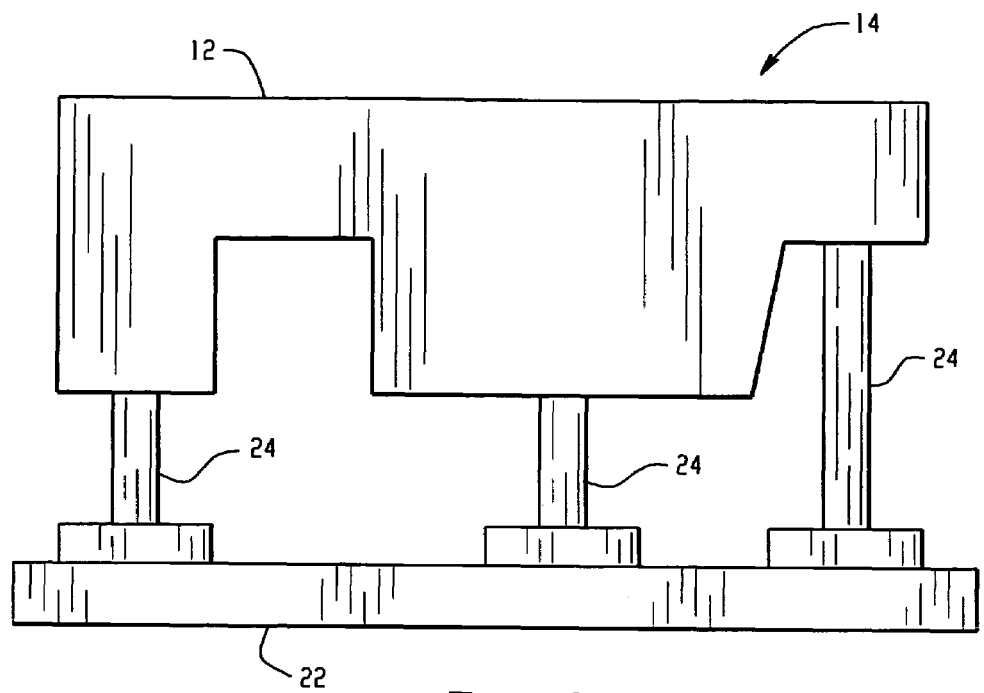
FIG. 2 is an exemplary depiction of a pallet 14 upon which is disposed the work piece 12 as it traverses an exemplary assembly line 10.

Referring now to FIG. 2, the pallet 14 upon which the work piece 12 is mounted includes a base 22 that supports multiple modular stanchions 24. The base material corresponds to the loads it is designed to carry. For example, the base 22 can be made of a strong metal material to support heavier products such as an engine. Other materials can be used to construct the base 22. The material is selected based on the type of load that it is required to support. As described in further detail below, the modular stanchions 24 are selectively coupled to the base 22 using a magnetic or other form of coupling. For magnetic couplings, the base 22 is required to be made of a magnetic or ferro-magnetic material such as steel.

Figure 3:
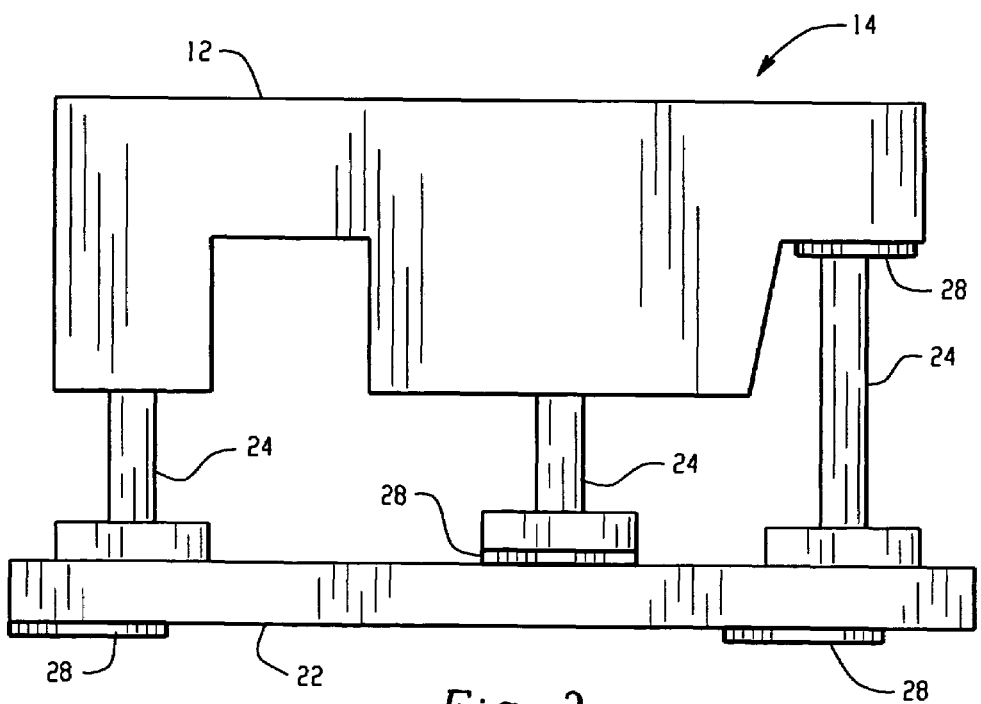
FIG. 3 is a exemplary depiction of positions where programmable shims can be used on a pallet 14 upon which is disposed the work piece 12 as it traverses an exemplary assembly line 10.

Referring now to an exemplary embodiment depicted in the FIG. 3, a programmable shim 28 may be used during the machining or assembly of the work piece 12 to facilitate alignment of the work piece 12 during assembly and/or machining operations. A programmable shim 28 is a device that is used to provide the work piece 12 with a small amount of reversible displacement prior to or during the machining or assembly processes thereby permitting alignment of the work piece. The programmable shim 28 permits vertical, horizontal and/or rotary motion of the work piece 12.

During a mass production process where a number of similar work pieces 12 are each sequentially subjected to repetitive and similar manufacturing operations, it may be desirable for the programmable shim to provide each work piece 12 with a different amount of displacement in order to minimize any variation in alignment or relative positioning between the respective work pieces 12 and other parts of the manufactured article. Thus, the displacement provided by the programmable shim 28 to the work piece 12 may vary from one work piece 12 to the next. Programmable shims 28 permit changes in the shim geometry or shim dimensions on demand, thereby allowing for tooling set-ups that can adapt quickly to changes and/or variations in geometry and/or dimensions of the work pieces being processed.

Figure 4:
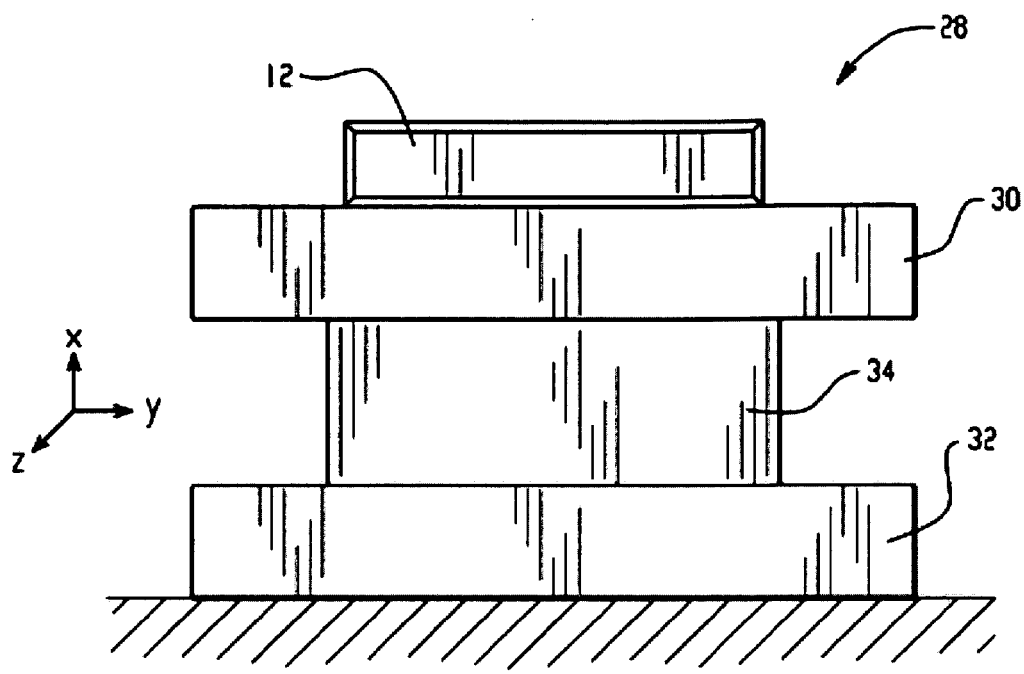
FIG. 4 is an exemplary depiction (side view) of a programmable shim 28 comprising an actuator 34 disposed between a first plate 30 and an optional reference frame 32.

FIG. 3 reflects a number of different positions where a programmable shim 28 may be used to facilitate alignment of the work piece 12 during the manufacturing process. In one embodiment, the programmable shim can be disposed under the base 22 of the pallet 14. In another embodiment, the shim 28 can be disposed between the modular stanchion 24 and the base 22 and is in operative communication with the modular stanchion 24 and the base 22. In yet another embodiment, the shim 28 can be disposed between the modular stanchion 24 and the work piece 12 and is in operative communication with the work piece 12 and the modular structure 24. In one exemplary embodiment as seen in FIG. 4, the programmable shim 28 comprises an actuator 34 disposed between a first plate and an optional reference frame 32. In yet another embodiment, the programmable shim 28 can be used to position one part of an assembly with respect to another position of the assembly during a manufacturing operation. The first plate 30 is in operative communication with the work piece 12, while the reference frame 32 may be in operative communication with the pallet 14, the modular stanchion 24 or any part of the manufacturing or processing equipment that are part of the assembly line 10.

The optional reference frame 32 may be a supporting plate, a post, a hydraulic lift, or the like, or any combination of structural elements that can support the actuator 34 and sustain the forces imposed by the actuator 34 on the first plate 30. The reference frame 32 is optional, since in some situations a programmable shim comprising the actuator 34 and the first plate 30 can provide the necessary alignment to the work piece 12, without the use of the reference frame 32.

The reference frame 32 should be capable of supporting any reactionary opposing forces imposed by the plate 30 on the frame via the actuator 34. The first plate 30 and the reference frame 32 may have any desired spatial relationship with each other. For example, as in the FIG. 4, the first plate 30 may be disposed upon the reference frame 32. In this embodiment, the first plate 30 is in a vertical spatial relationship with the actuator 34 and the reference frame 32. The first plate 30 upon actuation by the actuator 34 can however, move vertically, horizontally or rotationally with respect to the reference frame 32. In one embodiment, the reference frame in addition to supporting and positioning the first plate 30 can also serve to guide the first plate 30 during its displacement.

In one embodiment, additional plates that are in operative communication with the work piece 12, such as, for example, an optional second plate (not shown) and/or an optional third plate (not shown) may be employed in the programmable shim 28. In one embodiment, when additional plates are employed in the programmable shim 28, they may act cooperatively and synchronously with one another. In another embodiment, the additional plate may act independently from the first plate 30. The additional plates may use a single actuator 34 or may employ additional actuators to position a work piece 12 in a desired position.

Figure 5:
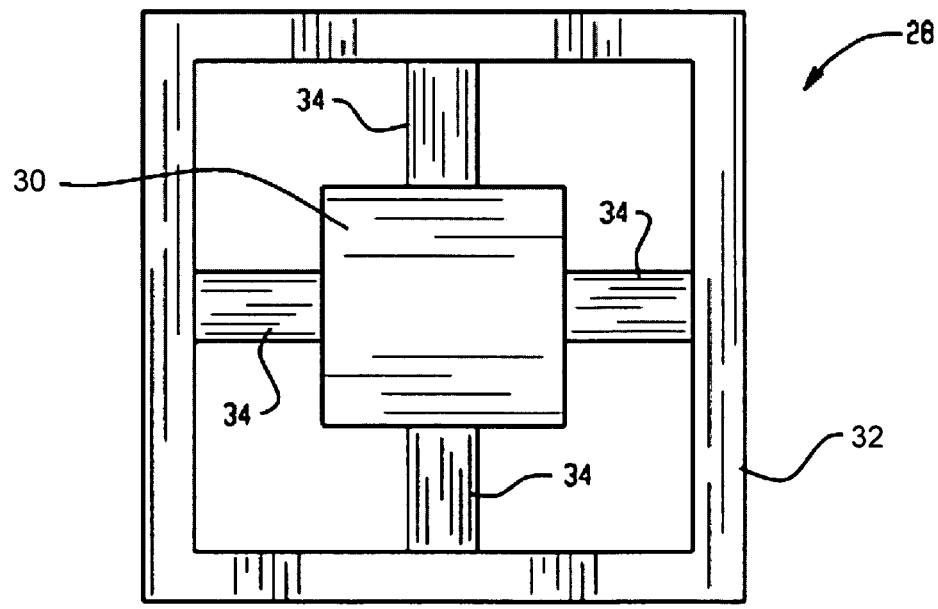
FIG. 5 depicts a top view (elevation) of a programmable shim 28 wherein the first plate 30 is surrounded by the reference frame 32, with the actuators 34 disposed therebetween.

In another embodiment, the first plate 30 may be disposed within the reference frame 32. In other words, the reference frame 32 may partially or completely surround the first plate 30. FIG. 5 depicts a top view (elevation), showing an example wherein the first plate 30 is surrounded by the reference frame 32, with the actuators disposed therebetween. In this embodiment, the first plate 30 is in a horizontal spatial relationship with the actuator 34 and the reference frame 32. The first plate 30 upon actuation by the actuator 34 can however, move vertically, horizontally or rotationally with respect to the reference frame 32.

The optional reference frame 32 and the first plate 30 may be manufactured from suitable materials such as, for example, metals, ceramics, polymers, or combinations thereof. Examples of suitable metals that may be used in the first plate 30 and the reference frame 32 include aluminum, iron, steel, brass, titanium, titanium alloys, or the like. Examples of ceramics that may be used in the optional reference frame 32 and the first plate 30 include light weight boron carbide, boron nitride, aluminum oxide, zirconia, silicon carbide, steatite, silicon nitride, lava, or the like. Examples of polymers that may be used in the optional reference frame 32 and the first plate 30 include polyimides, polycarbonates, polyetherimides, polyamides, polyesters, polyaramides, poly (meth)acrylates, or the like, or a combination comprising at least one of the foregoing polymers. In one embodiment, light-weight optional reference frames 32 and first plates 30 may be manufactured from composites comprising polymeric materials and fibers. Examples of suitable fibers include carbon fibers, glass fibers, polyaramid fibers, polyolefin fibers, or the like, or combinations comprising at least one of the foregoing fibers.

As may be seen in FIG. 4, the actuator 34 is in operative communication with the plate 30 and the reference frame 32 and facilitates the displacement of the first plate in the x, y and the z directions. The displacement of the first plate 30 may be brought about by linear motion, rotary motion about the x-axis, rotary motion about the y-axis and/or rotary motion about the z-axis. By promoting rotary motion about the y and/or the z-axis, the actuator 34 can promote the tilting of the first plate at an angle with the horizontal if so desired.

In one embodiment, the actuator 34 promotes the reversible displacement of the first plate and hence of the work piece 12 by virtue of an actuator element that employs active materials, which change their shape and/or stiffness in response to an external control stimulus or activation signal. Suitable examples of active materials that undergo changes in shape and/or stiffness are shape memory alloys (SMA), ferromagnetic SMA's, shape memory polymers (SMP), piezoelectrics, magnetostrictives, electroactive polymers (EAP), electrorheological fluids (ER), magnetorheological fluids (MR), magnetorheological polymers, or the like, or a combination comprising at least one of the foregoing materials. Suitable examples of such activation signals are thermal, electric, magnetic, radiation, chemical, or the like, or a combination comprising at least one of the foregoing stimulus.

In one embodiment, the active materials used in the actuator are shape memory materials. Shape memory materials generally refer to materials or compositions that have the ability to remember an original defined shape, which can subsequently be recalled by applying an external stimulus, i.e., an activation signal. As such, deformation of the shape memory material from the original shape can be a temporary condition, which can be used for fixturing a variety of work pieces having different surface contours. Exemplary shape memory materials suitable for use in the present disclosure include shape memory alloys, magnetic shape memory alloys, shape memory polymers, shape memory foams, shape memory ceramics, baroplastics, composites of the foregoing shape memory materials with non-shape memory materials, and combinations comprising at least one of the foregoing shape memory materials.

In another embodiment the active materials are of a class of materials that exhibit a reversible change in shape and/or stiffness which is proportional to the strength of the applied field and that return to their original defined shape/stiffness upon removal of the applied field. Exemplary active materials in this class include electroactive polymers, piezoelectrics, and magnetorheological polymers.

In yet another embodiment the active materials are of a class of materials that exhibit a reversible change in their shear strength that is proportional to the magnitude of an applied field and that return to their original shear strength upon removal of the applied field. Magnetorheological and electrorheological fluids are examples of active materials in this class.

For convenience and by way of example, reference herein will be made to shape memory polymers and shape memory alloys. The shape memory ceramics, baroplastics, and the like can be employed in a similar manner as will be appreciated by those skilled in the art in view of this disclosure. For baroplastic materials, a pressure induced mixing of nanophase domains of high and low Tg components effects the shape change. Baroplastics can be processed at relatively low temperatures repeatedly without degradation. Shape memory ceramics (SMC) are similar to shape memory alloys but because of the ceramic nature of SMCs, these materials can tolerate much higher operating temperatures than can other shape-memory materials. However, the recoverable strain of SMCs is relatively small compared to the other shape memory materials. An example of an SMC is a piezoceramic composite.

By utilizing an active material in the actuator 34, the actuator 34 can change its modulus properties, shear strength, and/or shape to provide improved positioning and position control between the first plate 30 and the optional reference frame 32. Applying an activation signal to the active material generally facilitates the displacement of the first plate 30 and/or the optional reference frame 32. Suitable activation signals will depend on the type of active material. Optionally, the actuator 34 may include one or more sensors that are used in combination with enhanced control logic to, for example, provide enhanced control, variable motion, bistable position-ing of the shims, and the like. Optionally, the active material, such as, an electroactive polymer or piezoelectric, may be used additionally (or solely) as a sensor whose signal (output) can serve to aid in establishing and holding the desired location.

The active materials in various embodiments can be used to fabricate a portion of the actuator 34 or the entire actuator 34. In one embodiment, the actuator 34 functions to displace the first plate with respect to the reference frame. In another embodiment, the actuator 34 in addition to displacing the first plate with respect to the reference frame, also functions as a position holding mechanism, i.e., the actuator can transmit a force effective to hold a work piece in a desired position. In another embodiment, the active materials can be configured to externally actively control the actuator 34, or can be configured to internally actively control the actuator 34. The active materials can permit the remote and automatic control of the shimming function and provide enhancements in control functionality through software modifications as well as through hardware changes. For example, in the case of assembly lines where machining is performed; control logic can be utilized to activate the active material in such a manner so as to provide accurate but adjustable alignment to the work piece 12. The shim, as a whole, has a stiffness and load carrying capabilities that compare favorably with those for the fixed geometry shims used in current practice. In one embodiment, the shims have the ability to hold a set position without power consumption (power-off hold) as well as the ability to move quickly between two variable positions.

Following is a list of active materials and their physical attributes that permit them to be advantageously employed as actuators in a programmable shim. Shape memory alloys (SMA's) generally refer to a group of metallic materials that demonstrate the ability to return to some previously defined shape or size when subjected to an appropriate thermal stimulus. Shape memory alloys are capable of undergoing phase transitions in which their flexural modulus, yield strength, and shape orientation are altered as a function of temperature. Generally, in the low temperature, or martensite phase, shape memory alloys can be plastically deformed and upon exposure to some higher temperature will transform to an austenite phase, or parent phase, returning to their shape prior to the deformation. Materials that exhibit this shape memory effect only upon heating are referred to as having one-way shape memory. Those materials that also exhibit shape memory upon re-cooling are referred to as having two-way shape memory behavior.

Shape memory alloys can exhibit a one-way shape memory effect, an intrinsic two-way effect, or an extrinsic two-way shape memory effect depending on the alloy composition and processing history. Annealed shape memory alloys typically only exhibit the one-way shape memory effect. Sufficient heating subsequent to low-temperature deformation of the shape memory material will induce the martensite to austenite type transition, and the material will recover the original, annealed shape. Hence, one-way shape memory effects are only observed upon heating. The use of external bias springs, allows one-way shape memory alloys to be used in actuators 34 that exhibit extrinsic two-way shape memory behavior.

Intrinsic and extrinsic two-way shape memory materials are characterized by a shape transition both upon heating from the martensite phase to the austenite phase, as well as an additional shape transition upon cooling from the austenite phase back to the martensite phase. Active connector elements that exhibit an intrinsic one-way shape memory effect are fabricated from a shape memory alloy composition that will cause the connector elements to automatically reform themselves as a result of the above noted phase transformations. Intrinsic two-way shape memory behavior must be induced in the shape memory material through processing. Such procedures include extreme deformation of the material while in the martensite phase, heating-cooling under constraint or load, or surface modification such as laser annealing, polishing, or shot-peening. Once the material has been trained to exhibit the two-way shape memory effect, the shape change between the low and high temperature states is generally reversible and persists through a high number of thermal cycles. In contrast, active connector elements that exhibit the extrinsic two-way shape memory effects are composite or multi-component materials that combine a shape memory alloy composition that exhibits a one-way effect with another element that provides a restoring force to return the first plate to another position or to its original position.

The temperature at which the shape memory alloy remembers its high temperature form when heated can be adjusted by slight changes in the composition of the alloy and through heat treatment. In nickel-titanium shape memory alloys, for instance, it can be changed from above about 100° C. to below about −100° C. The shape recovery process occurs, in general, over a range of several degrees and the start or finish of the transformation can be controlled to within a few degrees depending on the desired application and alloy composition.

Suitable shape memory alloy materials for fabricating the active connector elements include nickel-titanium based alloys, indium-titanium based alloys, nickel-aluminum based alloys, nickel-gallium based alloys, copper based alloys (e.g., copper-zinc alloys, copper-aluminum alloys, copper-gold, and copper-tin alloys), gold-cadmium based alloys, silver-cadmium based alloys, indium-cadmium based alloys, manganese-copper based alloys, iron-platinum based alloys, iron-palladium based alloys, or the like, or a combination comprising at least one of the foregoing shape memory alloys. The alloys can be binary, ternary, or any higher order so long as the alloy composition exhibits a shape memory effect, e.g., change in shape orientation, changes in yield strength, and/or flexural modulus properties, damping capacity, and the like.

The shape memory alloys used in the actuator element 34 may have any geometrical shape from which a change in shape and/or stiffness may be used to promote the motion of the first plate 30 relative to the reference frame 32. The shape memory alloys may be in the form of a wire, a film, a spring (e.g., helical spring, leaf spring, disc spring, or the like), a rod, a foam, a honey comb structure, a hollow device such as a cylinder, or the like, which will promote motion of the first plate 30 relative to the reference frame 32 upon the imposition of an activation signal. The preferred activation signal is a thermal activation signal.

The thermal activation signal may be applied to the shape memory alloy in various ways. It is generally desirable for the thermal activation signal to promote a change in the temperature of the shape memory alloy to a temperature greater than or equal to its austenitic temperature. Suitable examples of such thermal activation signals that can promote a change in temperature are the use of steam, hot oil, resistive electrical heating, or the like, or a combination comprising at least one of the foregoing signals. A preferred thermal activation signal is one derived from resistive electrical heating.

Shape memory polymers (SMP's) may also be used in the actuator 34 to move the first plate 30 with respect to the reference frame 32 or vice versa. They also may be used as reverse actuators since they exhibit a huge drop in modulus when activated. Their activation can free other actuators such as springs whose actuation is otherwise physically blocked by the shape memory polymer in its nonactivated, higher modulus state. Shape memory polymers generally refer to a group of polymeric materials that demonstrate the ability to return to some previously defined shape when subjected to an appropriate thermal stimulus. Shape memory polymers are capable of undergoing phase transitions in which their shape orientation is altered as a function of temperature. Generally, shape memory polymers have two main segments, a hard segment and a soft segment. The previously defined or permanent shape can be set by melting or processing the polymer at a temperature higher than the highest thermal transition followed by cooling below that thermal transition temperature. The highest thermal transition is usually the glass transition temperature (Tg) or melting point of the hard segment. A temporary shape can be set by heating the material to a temperature higher than the Tg or the transition temperature of the soft segment, but lower than the Tg or melting point of the hard segment. The temporary shape is set while processing the material at the transition temperature of the soft segment followed by cooling to fix the shape. The material can be reverted back to the permanent shape by heating the material above the transition temperature of the soft segment while the material is unloaded.

Generally, shape memory polymers are co-polymers comprised of at least two different units which may be described as defining different segments within the co-polymer, each segment contributing differently to the flexural modulus properties and thermal transition temperatures of the material. The term "segment" refers to a block, graft, or sequence of the same or similar monomer or oligomer units that are copolymerized with a different segment to form a continuous crosslinked-interpenetrating network of these segments. These segments may be combination of crystalline or amorphous materials and therefore may be generally classified as a hard segment(s) or a soft segment(s), wherein the hard segment generally has a higher glass transition temperature (Tg) or melting point than the soft segment. Each segment then contributes to the overall flexural modulus properties of the shape memory polymer and the thermal transitions thereof. When multiple segments are used, multiple thermal transition temperatures may be observed, wherein the thermal transiton temperatures of the copolymer may be approximated as weighted averages of the thermal transiton temperatures of its comprising segments. The previously defined or permanent shape of the shape memory polymer can be set by blow molding the polymer at a temperature higher than the highest thermal transition temperature for the shape memory polymer or its melting point, followed by cooling below that thermal transition temperature.

In practice, the shape memory polymers employed as an actuation element (to move the first plate 30 with respect to the reference frame 32) are alternated between one of at least two shape orientations such that at least one orientation will provide a size reduction relative to the other orientation(s) when an appropriate thermal signal is provided. To set a permanent shape, the shape memory polymer must be at about or above its melting point or highest transition temperature (also termed "last" transition temperature). The actuation element is generally shaped at this temperature by molding or shaped with an applied force followed by cooling to set the permanent shape. When deactivated, they, because of their substantial increase in modulus, can provide a zero power means of holding a specified position.

The temperature to set the permanent shape is generally between about 40° C. to about 300° C. After expansion by fluid, the permanent shape is regained when the applied force is removed, and the expanded shape memory polymer is again brought to or above the highest or last transition temperature of the shape memory polymer. The Tg of the shape memory polymer can be chosen for a particular application by modifying the structure and composition of the polymer. Transition temperatures of suitable shape memory polymers generally range in an amount of about −63° C. to above about 160° C. Engineering the composition and structure of the polymer itself can allow for the choice of a particular temperature for a desired application. A preferred temperature for shape recovery is greater than or equal to about −30° C., more preferably greater than or equal to about 20° C., and most preferably a temperature greater than or equal to about 70° C. Also, a preferred temperature for shape recovery is less than or equal to about 250° C., more preferably less than or equal to about 200° C., and most preferably less than or equal to about 180° C.

Suitable shape memory polymers can be thermoplastics, interpenetrating networks, semi-interpenetrating networks, or mixed networks. The polymers can be a single polymer or a blend of polymers. The polymers can be linear or branched thermoplastic elastomers with side chains or dendritic structural elements. Suitable polymer components to form a shape memory polymer include, but are not limited to, polyphosphazenes, poly(vinyl alcohols), polyamides, polyester amides, poly(amino acid)s, polyanhydrides, polycarbonates, polyacrylates, polyalkylenes, polyacrylamides, polyalkylene glycols, polyalkylene oxides, polyalkylene terephthalates, polyortho esters, polyvinyl ethers, polyvinyl esters, polyvinyl halides, polyesters, polylactides, polyglycolides, polysiloxanes, polyurethanes, polyethers, polyether amides, polyether esters, and copolymers thereof. Examples of suitable polyacrylates include poly(methyl methacrylate), poly(ethyl methacrylate), poly(butyl methacrylate), poly(isobutyl methacrylate), poly(hexyl methacrylate), poly(isodecyl methacrylate), poly(lauryl methacrylate), poly(phenyl methacrylate), poly(methyl acrylate), poly(isopropyl acrylate), poly(isobutyl acrylate) and poly(octadecyl acrylate). Examples of other suitable polymers include polystyrene, polypropylene, polyvinyl phenol, polyvinylpyrrolidone, chlorinated polybutylene, poly(octadecyl vinyl ether), ethylene vinyl acetate, polyethylene, poly(ethylene oxide)-poly(ethylene terephthalate), polyethylene/nylon (graft copolymer), polycaprolactones-polyamide (block copolymer), poly(caprolactone) dimethacrylate-n-butyl acrylate, poly(norbornyl-polyhedral oligomeric silsequioxane), polyvinylchloride, urethane/butadiene copolymers, polyurethane block copolymers, styrene-butadiene-styrene block copolymers, or the like, or a combination comprising at least one of the foregoing polymers.

As with the shape memory alloys, when a shape memory polymer is used as the activation and/or position holding element in the actuator 34, a variety of geometrical shapes, as listed above, may be utilized. Additionally a variety of activation signals may be used. The preferred activation signal is a thermal activation signal provided by resistive heating.

Magnetorheological (MR) fluids and elastomers are known as "active" materials whose Theological properties can rapidly and reversibly change upon application of a magnetic field. Magnetorheological fluids are suspensions of micrometer-sized, magnetically polarizable particles in oil or other liquids. When a magnetorheological fluid is exposed to a magnetic field, the normally randomly oriented particles form chains of particles in the direction of the magnetic field lines. The particle chains increase the apparent viscosity (flow resistance) of the fluid. The stiffness of the structure comprising the particle chains is adjusted by changing the shear and compression/tension modulii of the MR fluid by varying the strength of the applied magnetic field. The magnetorheological fluids typically develop structure when exposed to a magnetic field in as little as a few milliseconds. Discontinuing the exposure of the magnetorheological fluid to the magnetic field reverses the process and the fluid returns to a lower viscosity state.

As noted above the actuation element in the actuator 34 may be a magnetorheological material. Magnetorheological materials generally comprise magnetorheological fluids and magnetorheological elastomers. Magnetorheological fluids are generally used for position holding. Magnetorheological elastomers experience an increase in the shear stiffness upon application of a magnetic field, hence their pre-yield elastic response can be controlled. Thus, the yield stress of magnetorheological elastomers can be controlled and the point of transfer from an elastic to plastic material response can also be determined by varying the magnetorheological elastomer composition. There is very little or no change in the viscosity (or the ratio between the shear stress and strain rate) with applied field in magnetorheological fluids.

The term magnetorheological fluid encompasses magnetorheological fluids, ferrofluids, colloidal magnetic fluids, and the like.

Suitable magnetorheological fluids include ferromagnetic or paramagnetic particles dispersed in a carrier fluid. Suitable particles include iron; iron alloys, such as those including aluminum, silicon, cobalt, nickel, vanadium, molybdenum, chromium, tungsten, manganese and/or copper; iron oxides, including $Fe_2O_3$ and $Fe_3O_4$; iron nitride; iron carbide; carbonyl iron; nickel and alloys of nickel; cobalt and alloys of cobalt; chromium dioxide; stainless steel; silicon steel; or the like, or a combination comprising at least one of the foregoing particles. Examples of suitable iron particles include straight iron powders, reduced iron powders, iron oxide powder/straight iron powder mixtures and iron oxide powder/reduced iron powder mixtures. A preferred magnetic-responsive particulate is carbonyl iron, preferably, reduced carbonyl iron.

The particle size should be selected so that the particles exhibit multi-domain characteristics when subjected to a magnetic field. Diameter sizes for the particles can be less than or equal to about 1,000 micrometers, with less than or equal to about 500 micrometers preferred, and less than or equal to about 100 micrometers more preferred. Also preferred is a particle diameter of greater than or equal to about 0.1 micrometer, with greater than or equal to about 0.5 more preferred, and greater than or equal to about 10 micrometer especially preferred. The particles are preferably present in an amount between about 5.0 and about 50 percent by volume of the total composition.

Suitable carrier fluids include organic liquids, especially non-polar organic liquids. Examples include, but are not limited to, silicone oils; mineral oils; paraffin oils; silicone copolymers; white oils; hydraulic oils; transformer oils; halogenated organic liquids, such as chlorinated hydrocarbons, halogenated paraffins, perfluorinated polyethers and fluorinated hydrocarbons; diesters; polyoxyalkylenes; fluorinated silicones; cyanoalkyl siloxanes; glycols; synthetic hydrocarbon oils, including both unsaturated and saturated; and combinations comprising at least one of the foregoing fluids.

The viscosity of the carrier component can be less than or equal to about 100,000 centipoise, with less than or equal to about 10,000 centipoise preferred, and less than or equal to about 1,000 centipoise more preferred. Also preferred is a viscosity of greater than or equal to about 1 centipoise, with greater than or equal to about 250 centipoise preferred, and greater than or equal to about 500 centipoise especially preferred.

Aqueous carrier fluids may also be used, especially those comprising hydrophilic mineral clays such as bentonite and hectorite. The aqueous carrier fluid may comprise water or water comprising a small amount of polar, water-miscible organic solvents such as methanol, ethanol, propanol, dimethyl sulfoxide, dimethyl formamide, ethylene carbonate, propylene carbonate, acetone, tetrahydrofuran, diethyl ether, ethylene glycol, propylene glycol, and the like. The amount of polar organic solvents is less than or equal to about 5.0% by volume of the total magnetorheological fluid, and preferably less than or equal to about 3.0%. Also, the amount of polar organic solvents is preferably greater than or equal to about 0.1%, and more preferably greater than or equal to about 1.0% by volume of the total magnetorheological fluid. The pH of the aqueous carrier fluid is preferably less than or equal to about 13, and preferably less than or equal to about 9.0. Also, the pH of the aqueous carrier fluid is greater than or equal to about 5.0, and preferably greater than or equal to about 8.0.

Natural or synthetic bentonite or hectorite may be used. The amount of bentonite or hectorite in the magnetorheological fluid is less than or equal to about 10 percent by weight of the total magnetorheological fluid, preferably less than or equal to about 8.0 percent by weight, and more preferably less than or equal to about 6.0 percent by weight. Preferably, the bentonite or hectorite is present in greater than or equal to about 0.1 percent by weight, more preferably greater than or equal to about 1.0 percent by weight, and especially preferred greater than or equal to about 2.0 percent by weight of the total magnetorheological fluid.

Optional components in the magnetorheological fluid include clays, organoclays, carboxylate soaps, dispersants, corrosion inhibitors, lubricants, extreme pressure anti-wear additives, antioxidants, thixotropic agents and conventional suspension agents. Carboxylate soaps include ferrous oleate, ferrous naphthenate, ferrous stearate, aluminum di- and tri-stearate, lithium stearate, calcium stearate, zinc stearate and sodium stearate, and surfactants such as sulfonates, phosphate esters, stearic acid, glycerol monooleate, sorbitan sesquioleate, laurates, fatty acids, fatty alcohols, fluoroaliphatic polymeric esters, and titanate, aluminate and zirconate coupling agents and the like. Polyalkylene diols, such as polyethylene glycol, and partially esterified polyols can also be included.

Suitable magnetorheological elastomer materials include an elastic polymer matrix comprising a suspension of ferromagnetic or paramagnetic particles, wherein the particles are described above. Suitable polymer matrices include poly-alpha-olefins, copolymers of poly-alpha-olefins and natural rubber. In some situations, formulations that may be described as magnetorheological elastomers may also fall under the definition of magnetorheological fluids, and vice versa.

The activation device 24 can be configured to deliver an activation signal to the actuator elements, wherein the activation signal comprises a magnetic signal. The magnetic signal is a magnetic field. The magnetic field may be generated by a permanent magnet, an electromagnet, or combinations comprising at least one of the foregoing. The magnitude of the applied field strength is the amount needed to variously promote a displacement or fix the location of the first plate 30 with respect to the reference frame 32. Suitable magnetic flux densities for the actuator elements comprised of MR fluids or elastomers range from greater than about 0 to about 1 Tesla.

As noted above, the position holding element of an actuator may be an electrorheological (ER) fluid. Electrorheological fluids are most commonly colloidal suspensions of fine particles in non-conducting fluids. Under an applied electric field, electrorheological fluids form fibrous structures that are parallel to the applied field and can increase in viscosity by a factor of up to $10^5$. The change in viscosity is generally proportional to the applied potential. Electrorheological fluids are made by suspending particles in a liquid whose dielectric constant or conductivity is mismatched in order to create dipole particle interactions in the presence of an alternating current (ac) or direct current (dc) electric field.

The actuator element may also be an electroactive polymer (EAP). Exemplary electroactive polymers for use in the actuator are dielectric elastomers. In one embodiment, the design feature of devices based on these materials is the use of compliant electrodes that enable polymer films to expand or contract in the in-plane directions in response to applied electric fields or mechanical stresses. When electroactive polymers are used as the actuator element, strains of greater than or equal to about 100%, pressures greater than or equal to about 50 kilograms/square centimeter ($kg/cm^2$) can be developed in response to an applied voltage. The fully reversible electromechanical response of these materials, as well as other characteristics such as good environmental tolerance and long-term durability, make them suitable for actuator elements under a variety of manufacturing conditions. Electroactive polymers are suitable for use as an actuator element in many actuator configurations including stacks, rolls, tubes, unimorphs, bimorphs, diaphragms, and inchworm-like devices.

In many cases, electroactive polymers may be fabricated and implemented as thin films. Thicknesses suitable for these thin films may be below 50 micrometers.

As electroactive polymers may deflect at high, applied voltages, electrodes attached to the polymers should also deflect without compromising mechanical or electrical performance. Generally, electrodes suitable for use may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer are preferably compliant and conform to the changing shape of the polymer. Correspondingly, the present disclosure may include compliant electrodes that conform to the shape of an electroactive polymer to which they are attached. The electrodes may be only applied to a portion of an electroactive polymer and define an active area according to their geometry. Various types of electrodes suitable for use with the present disclosure include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes may vary. Suitable materials used in an electrode may include graphite, carbon black, carbon nanotubes, colloidal suspensions, thin metals including silver and gold, silver filled and carbon filled gels and polymers, and ionically or electronically conductive polymers. It is understood that certain electrode materials may work well with particular polymers and may not work as well for others. By way of example, carbon nanotubes work well with acrylic elastomer polymers while not as well with silicone polymers.

The electroactive polymers used herein, are generally conjugated polymers. Suitable examples of electroactive polymers are poly(aniline), substituted poly(aniline)s, polycarbazoles, substituted polycarbazoles, polyindoles, poly(pyrrole)s, substituted poly(pyrrole)s, poly(thiophene)s, substituted poly(thiophene)s, poly(acetylene)s, poly(ethylene dioxythiophene)s, poly(ethylenedioxypyrrole)s, poly(p-phenylene vinylene)s, or the like, or combinations comprising at least one of the foregoing electroactive polymers. Blends or copolymers or composites of the foregoing electroactive polymers may also be used. Similarly blends or copolymers or composites of an electroactive polymer with an electroactive polymers precursor may also be used. In one embodiment, the active materials detailed above may be used as actuator elements in motors such as electric stepper motors, inchworms, piezoelectric inchworms, ultrasonic motors, electrohydrostatic actuators, nanomotion piezoelectric motors, compact hybrid actuator devices (CHAD), or the like. These motors can be used in programmable shims and various details of the use of some of these motors in programmable shims are provided below.

In one embodiment, an electric stepper motor is used as the actuator 34. In this embodiment, one or more electric stepper motors are used as the primary actuators that adjust the configuration of the work piece 12 relative to the tooling or the optional reference frame 32. As noted above, the work piece 12 is in operative communication with the first plate 30. Depending on the spatial constraints, the stepper motor(s) can directly displace the first plate 30 relative to tooling or the reference frame 32, or alternatively, the motor(s) can drive a mechanism (e.g., a jack used to raise an automobile for changing wheels or tires, or single-piece elastic equivalents, etc.) that displaces the first plate 30 relative to tooling or the reference frame 32.

Stepper motors are generally used for accurate position control where moderate driving force is required. Stepper motor-based linear actuators comprise stepper motors with internally geared armatures driving leadscrews. In one embodiment, a motor rated for a specific maximum torque can deliver a range of linear forces by varying the thread type and size of the leadscrew. The leadscrews have a low helix angle that endows these actuators with a power-off hold capability. A power-off hold capability is one wherein the actuator can support a given load (e.g., work piece) when power is not actively supplied to the actuator.

In another embodiment, one or more electrically driven hydraulic linear actuators can be used as actuators 34 in the programmable shim. Electro-hydraulic actuators comprise an electric motor driving a hydraulic pump that feeds a piston-cylinder arrangement for linear motion or a rotary motor for angular motion. In one embodiment, a simple electrically operated check valve is used to provide power-off hold.

Electro-hydraulic actuators exhibit variable acceleration and deceleration, through motor control and the use of hydraulic valves, to provide smooth, load raising and lowering characteristics. It is generally desirable to use hydraulic actuators that can provide a force of up to about 1200 kilograms, has a stroke of up to about 10 centimeters and a resolution of 0.005 centimeters or greater.

In another embodiment, one or more ultrasonic motors are used to drive leadscrew(s) or mechanism(s) that position and/or orient the first plate 30 of the programmable shim relative to the reference frame 32. The motor comprises a piezoelectric material that generates a progressive elastic wave, which travels around the circumference of an elastic stator. The stationary stator is pressed against a rotor that rides on a bearing. Frictional contact between the rotor and the stator at the crests of the progressive wave generate a torque that drives the rotor in a direction opposite to that of the wave. Ultrasonic motors are capable of continuous rotation and the stroke length is dictated only by space limitations of the supporting elements. Depending on the choice of the leadscrew or positioning mechanism, programmable shims based on these motors can be used for light to moderately heavy work pieces. Ultrasonic motors that provide linear displacement as output can also be used in a programmable shim. Ultrasonic motors having a built-in power-off hold capability can be adapted for use in the actuator.

In another embodiment, inchworm-based programmable shims may be used for the repositioning of work pieces 12 during machining or assembly operations. Inchworms are incremental motion actuators that mimic the traveling wave mode of locomotion seen in many crawling insects. Programmable shims based on inchworm actuators have three actuators that move the first plate 30 with respect to the optional reference frame 32. Two of the actuators are used to drive brakes (which can be used to facilitate position holding) or other locking devices (e.g., ratchets) located at either end of the actuator, while the third actuator can be used to change the length of the actuator between the two ends.

The first plate 30 is fixed to the body of the actuator and the locking devices are used to rigidly clamp one or both ends of the actuator to the reference frame 32. The locking devices provide an inherent power-off hold capability in inchworm actuators. Various actuators can be used in the inchworm depending on the size, weight, and load requirements e.g. electric motors can be used for moderate to heavy loads and large working volumes, while active materials like shape memory alloys, piezoelectric materials, electro-active polymers, or the like can be used for small working volumes and light to moderate loads.

An example of an inchworm actuator is the piezoceramic-stack driven inchworm This device uses a super-elastic clamping surface that allows high braking or holding forces without restricting the resolution of the device. Inchworm actuators can be used in programmable shims for low to moderate load applications.

In yet another embodiment, one or more Compact Hybrid Actuator Devices (CHADs), can be adapted to function as actuators in programmable shims. In one embodiment, the CHAD employs a miniaturized electro-hydrostatic actuator to position a work piece in operative communication with the programmable shim. In one embodiment, activation of the programmable shim is accomplished by using a shape memory alloy membrane to convert electrical energy into mechanical energy. The membrane is used as a pump to drive a hydraulic cylinder. Fluid rectification provided by electrically operated check valves provide a power-off hold capability for the programmable shim and also allows fine position control. Programmable shims based on CHAD actuators are suitable for small-stroke, moderate-load applications that require fine position control.

In yet another embodiment, one or more dielectric elastomer-based actuators can be used as the actuators in programmable shims. These actuators can be used as the primary actuators in the programmable shims. Dielectric elastomers based actuators are actuated by the electrostatic compression of an elastic, dielectric polymer film that is disposed between two complaint electrodes. A suitable form for the actuator is a thin film sandwiched between two highly compliant electrodes. As the voltage is increased, the electrostatic forces compress the elastomer film between the electrodes. The film expands in the plane of the electrodes as a result of the compressive forces. Pre-stretching the dielectric elastomer film enhances this effect significantly. Dielectric elastomer based actuators can be utilized in programmable shims where moderate-stroke is desirable and where moderate-loads are to be supported.

In yet another embodiment, thermal actuators can be used in programmable shims. Thermal actuators use the strain produced by thermal expansion to drive an external load such as, for example, the work piece 12. In one embodiment, this expansion occur in the solid state (e.g., involving a phase change such as in shape memory alloys or simple thermal expansion leading to a change in dimension, or the like. In another embodiment, this expansion can occur as the result of a phase change between the solid, liquid, and/or gaseous phases (e.g., change in volume accompanying expansion of water transforming into steam, melting of wax, or the like). Actuators based on the use of internal combustion or pyrotechnics can also be used in the programmable shims.

In yet another embodiment, the programmable shims can use shape memory alloy based actuators. Shape memory alloys are described above. Shape memory alloy actuators can be used in a programmable shim in many different ways. The inchworm-based design can employ shape memory alloy actuation instead of piezoelectric actuation. Similarly the CHAD-based design detailed above uses a shape memory alloy membrane as the primary actuator.

Shape memory polymers can be used as the actuator in programmable shims. As noted above, application of heat can drastically change the elastic modulus of the shape memory polymers, (e.g., heating these materials above a characteristic temperature known as the glass transition temperature for the lower melting phase changes the material from a stiff, glassy form to a soft, polymeric form). This property can be used to make programmable shims, in which an intrinsic power-off hold capability is obtained by making some or all of the structural members from shape memory polymeric materials. Baroplastics and shape memory ceramics may also be used instead of shape memory polymers for some applications.

When a shape memory polymer is used as the actuator, the geometry of the shape memory polymer members can be changed by the application of heat to adjust the relative position and/or orientation of the work piece 12 with respect to the optional reference frame 32. Shape memory polymer materials generally have two phases with different glass transition temperatures. For purposes of this disclosure, these glass transition temperatures may be identified as a lower temperature phase glass transition temperature ($Tg1$) and a higher temperature phase glass transition temperature ($Tg2$). A first shape is set at a temperature of greater than or equal to $Tg2$. The shape memory polymer is then set into a second shape having dimensions that are generally less than those of the first shape. When the shape is heated above the $Tg1$, the modulus of the shape memory polymer decreases and if the shape memory polymer does not have external forces acting on it, it returns to the memorized first shape. If forces are exerted on the shape memory polymer when in its soft state at a temperature above the $Tg1$, it will be easily deformed. If sufficient force continues to act on the shape memory polymer to hold it in its deformed shape as it is cooled below the transition temperature of the lower phase, this shape is set in the shape memory polymer and will remain even after the force is removed. The shape memory polymer will re-soften when reheated above the transition temperature of the lower phase and will either revert to the trained shape if unloaded or readily deform if acted on by external forces.

Shape memory polymers may be utilized in programmable shims 28 in conjunction with external actuation means to facilitate repositioning of the work piece. These programmable shims 28 would be mounted on the fixturing device, heated while proper positioning is established, and then quickly cooled so that the shape needed for proper alignment was set in the shim. Any additional changes can be accomplished by reheating the programmable shim 28.

Composite materials or composite designs comprising shape memory alloys and shape memory polymers possess unique properties that make them attractive for use in a programmable shim 28. In a shim made of such a composite material, the shape memory polymer can be used as a structural component, whose stiffness can be adjusted, while the shape memory alloy provides an embedded actuation capability. Close integration of the actuation and structural components enables compact shim design.

In one embodiment, it is desirable to use a feedback loop to establish the position of the top plate 30 with respect to the reference frame 32. The feedback loop can be used to ensure that the shim attains and maintains the desired work piece alignment or configuration. The feedback loop can use information derived by measuring work piece dimensional variation and using the information to change the dimensions and/or geometry of the shim. However, force feedback could also be used to determine the position of the programmable shim prior to adjusting the workpiece.

In one embodiment, related to the use of force feedback, the programmable shim is in operative communication with a sensor such as, for example, a piezo sensor. A given workpiece 12 with nominal settings and acceptable variation will produce a particular force pattern in a monitoring station. Any work piece 12 that generates a force pattern that is out of specification, will facilitate a displacement in the programmable shim 28 to accommodate the variation or to adjust for it.

The programmable shims 28 can be advantageously used to reposition or align loads during manufacturing and/or assembly. It is desirable for the programmable shims to be capable of imparting motion to a work piece having a weight of about 0.5 kilogram (kg) to about 10,000 kilograms. In one embodiment, the programmable shims 28 can be advantageously used to reposition low loads (weights) of about 1 kilogram to about 50 kilograms. In another embodiment, the programmable shims 28 can be advantageously used to reposition moderate weights of about 51 kilograms to about 500 kilograms. In yet another embodiment, the programmable shims 28 can be advantageously used to reposition large weights of about 501 kilograms to about 10,000 kilograms.

It is generally desirable for the programmable shim to be of sufficient stiffness be able to hold the work piece in the desired location under the potentially varying loads occurring during the manufacturing process. In one embodiment, the programmable shims to displace the work piece 12 a distance of about 1 micrometer to about 100 millimeters. In yet another embodiment, the actuator enables the shim to have an accuracy of about 0.0001 micrometers to about 50 micrometers from a specified reference point and a resolution of 0.0001 millimeter. The shim is capable of a full range of motion in a time period of about 1 second to about 10 minutes. The shim may also be used on machine tools that are used in the manufacturing of the work piece. For example, a robotic tool utilized in manufacturing may actively employ a programmable shim for purposes of making small adjustments during a machining or welding process. Computers and other forms of feedback loops may be employed to facilitate the adjustment of the work piece when using programmable shims.

The following examples, which are meant to be exemplary, not limiting, illustrate compositions and methods for manufacturing the programmable shims described herein.

EXAMPLES

A number of actuator and braking mechanisms have been discussed in the following examples. These examples are chosen for illustrative purposes and it is understood that other combinations of actuation and braking mechanisms can be used to construct programmable shims.

Example 1

Figure 6:
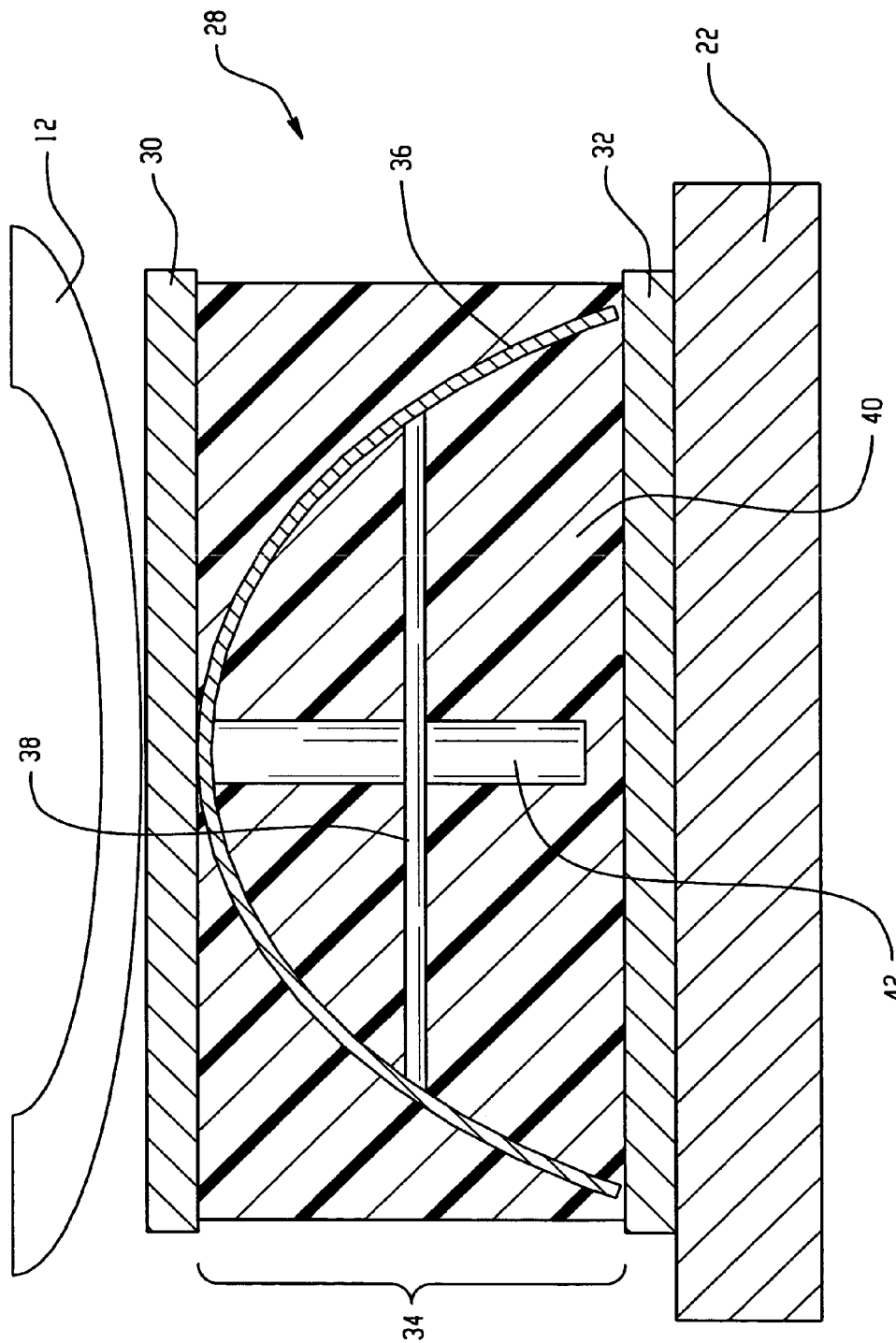
FIG. 6 is a schematic depicting an exemplary embodiment of a programmable shim 28 that exploits the properties of shape memory alloys and shape memory polymeric materials.

This example illustrates the use of a programmable shim based on the use of a shape memory alloy—shape memory polymer composite. FIG. 6 depicts an exemplary embodiment of a programmable shim 28 that exploits the properties of shape memory alloys and shape memory polymeric materials. The programmable shim 28 comprises a first plate 30 and a reference frame 32, having an actuator 34 disposed therebetween. A work piece 12 is disposed upon the first plate 30 and is in operative communication with it. The reference frame 32 is optionally disposed upon a base 22 that may be a part of the assembly line.

In one embodiment, the actuator 34 comprises one or more shell 36 (hereinafter shell 36) and one or more actuator elements that are surrounded by a shape memory polymer matrix 40. An exemplary actuator element is a wire 38 as depicted in the FIG. 6. The shell 36 and the wire 38 are in intimate contact with the shape memory polymer matrix 40. The wire 38 is used to deform the shell 36 and the surrounding shape memory polymer matrix 40. The wire 38 can take several alternative forms such as, for example, a rod, a chain, a spring, or the like. In one embodiment, the wire 38 can comprise a shape memory alloy wire bundle that is affixed to the inner surface of the shell 36. The inner surface of the shell 36 is the concave surface. The wire 38 can deform the shell 36, and thereby promote the expansion and/or contraction of the programmable shim 28. Additional structural elements, such as, for example, one or more structural members 42, may be used to control the stiffness distribution of the programmable shim 28. The wire 38, the shell 36, the shape memory polymer matrix 40 and the structural members 42 act cooperatively to facilitate realignment or repositioning of a work piece 12 that is in operative communication with the first plate 30.

In one embodiment, in one method of operating the exemplary programmable shim 28 depicted in the FIG. 6, the dimensions of the programmable shim 28 are established when it is heated to a temperature greater than or equal to about Tg1 and less than or equal to about Tg2 of the shape memory polymer matrix 40. During this heating, the programmable shim 28 is in its unloaded state, i.e., no load or work piece 12 is disposed upon the shim 28. The pre-strained shape memory alloy wire 38 is below its respective transition temperature and in this condition, the wire is assumed to be un-powered (i.e., in a non-activated state). The programmable shim is then cooled down to the regular working temperature (Tw) for the shim. In this condition, the shape memory polymer matrix 40 is in its high modulus state as Tw is below Tg1 for the shape memory polymer. Hence, the shape memory polymer matrix bears most of the load that is placed upon the programmable shim 28.

A work piece 12 is then mounted on the programmable shim 28. If the work piece 12 is to be re-positioned, the wire 38 is activated by passing an actuation current through it. Resistive heating of the pre-strained shape memory alloy wire 38 produces a solid-state phase transformation in the shape memory alloy material. This phase transformation drives the material to recover its strain-free configuration. This recovery is resisted by the shell 36 and the shape memory polymer matrix 40. As a result of this resistance, stress is exerted on the shell 36 and the shape memory polymer matrix 40 by the wire 38.

After the wire 38 is activated, the shape memory polymer matrix 40 is heated to a temperature above Tg1, whereby it transforms to a soft, polymeric form. The shape memory polymer matrix 40, shell 36 and wire 38 are chosen such that, when the shape memory polymer matrix 40 is in its soft polymeric form, most of the external load is resisted by the structural elements 42 and the shell, whose deformation is controlled by the wire. The actuation current flowing through the wire 38 is then varied to control the deformation of shell 36, and the consequently the motion of first plate 30 relative to reference frame 32.

When the desired position and/or orientation adjustment of first plate 30 and hence the work piece 12 is completed, the temperature of the shape memory polymer matrix 40 is lowered to below Tg1, while holding constant the position or alignment of the work piece 12 by controlling the actuation current to the wire 38. Cooling to a temperature below Tg1, restores the shape memory polymer matrix 40 to below its glassy form, which permits it to be capable of sustaining higher loads. The actuation current flowing through the wire 38 is then switched off. Some elastic strain is locked in the shells as the shape memory polymer matrix stiffens around it, while it is in the actuated state. In this condition, the external load (i.e., the work piece 12) is supported by a combination of the shape memory polymer matrix 40, the shell 36 and the structural elements 42.

Changing the position or alignment of the programmable shim 28 can be accomplished by repeating the above steps for the next work piece. In one embodiment, the displacement of the wire 38 can be amplified by choosing a suitable configuration (i.e., geometry, elastic modulus, size, or the like) of the shell 36, thereby allowing a larger stroke for the programmable shim 28 than is permissible by the deformation of the wire 38 alone.

The shell 36 also provides an elastic recovery mechanism for the programmable shim 28. The embodiment heretofore detailed permits the vertical dimension of the programmable shim to be increased in only one direction. The use of a second actuator element (not shown) alongside the wire 38 that can be actuated in a direction opposite to the direction of actuation of the wire, or the use of an additional set of external biasing spring-like elements can yield a programmable shim 28 that is capable of bi-directional height changes. A biasing element is one that provides a restoring force to the first plate to facilitate returning it to its original position.

In one embodiment, the adjustment of the work piece 12 can be affected by the programmable shim after the shim is loaded with the work piece. This is desirable to allow interactive position and alignment setting. In another embodiment, the dimension can be changed before the work piece is loaded onto the programmable shim. In the latter case, the wire 38 can be selected for much smaller maximum force capabilities.

The temperature of the wire 38 can be changed through resistive heating, convective heating (e.g., fluid jets impinging on the surface, fluid channeled through the shim body, or the like), radiant heating (e.g., flash lamps, microwave heating, radio frequency heating, or the like), induction heating or combinations comprising at least one of the foregoing methods of heating.

While the programmable shim in the FIG. 6 utilizes an actuator that comprises a shape memory alloy, other actuating materials or other actuators can be advantageously used instead of the shape memory alloy. Other materials such as steel, piezoelectrics, ferromagnetic shape memory alloys, electroactive polymers, and magnetorheological elastomers, or the like can be used instead of shape memory alloys as the actuator element in programmable shim designs. Even without the use of active materials, a similar actuating effect can be achieved by the use of constrained thermal expansion. Other variations in the design of the shell 36, the actuator wire 38, the structural elements 42 and the shape memory polymer matrix 40 are also possible.

For example, the structural elements 42 can be designed to perform two functions. In one embodiment, they can be designed to distribute the shape memory polymer matrix 40 uniformly through the shim volume while the shim height is being adjusted and set. In a second embodiment, they can be designed to increase the load carrying capacity of the programmable shim 28 by reducing the effective contribution of the shape memory polymer matrix to the overall stiffness of the programmable shim 28. Many other embodiments of programmable shims made from composite designs that comprise shape memory polymers and shape memory alloys are possible.

Example 2

Figure 7:
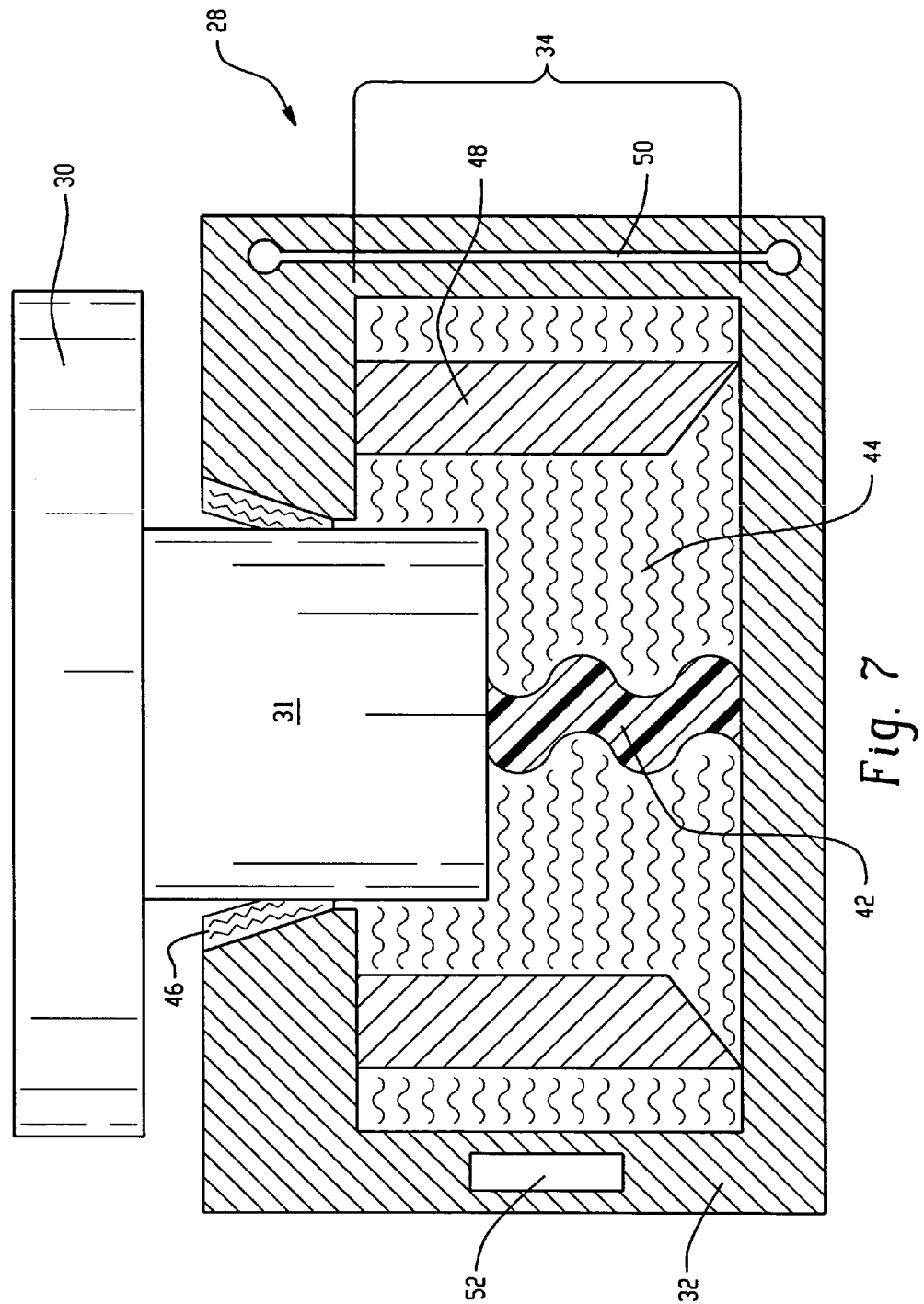
FIG. 7 is a schematic depicting an exemplary embodiment of a programmable shim that employs solid-state thermal expansion or phase changes between solid, liquid, and gaseous phases to drive an external load.

This exemplary embodiment which uses the strain produced by thermal expansion to drive an external load is depicted in the FIG. 7. As noted above, the actuator 34 that promotes the displacement of the first plate 30 with respect to the reference frame 32 may use solid state thermal expansion or may use a phase change between the solid, liquid, and/or gaseous phases to promote the expansion. Actuators based on the use of internal combustion or pyrotechnics can also be used in this example.

Paraffin-based actuators provide mechanical work from the 15% volumetric expansion of paraffin that occurs during the solid-to-liquid phase change when the paraffin is heated. On cooling, the paraffin contracts to revert to its original volume, thereby resetting the actuator. Commercial High Output Paraffin (HOP) actuators are small solenoid-shaped linear motors that can provide about 50 to about 350 pound-force (lbf) of force over about 0.25 inches to about 1.25 inches of displacement occurring over about 15 seconds to about 10 minutes for a lifetime of 5000 full-load, full-stroke cycles.

As may be seen in the FIG. 7, the programmable shim 28 comprises a first plate 30 that is supported by a paraffin bath 44 and frictional contact between the piston 31 and the reference frame 32. The first plate 30 comprises a piston 31 that contacts the paraffin contained in the paraffin bath 44. The reference frame 32 provides support and guidance to the first plate 30. The piston 31 is in slideable communication with the reference frame 32. Friction between the piston 31 and the reference frame 32 can be adjusted by brake linings 46 disposed upon the mouth 33 of the reference frame 32.

The brake linings 46 are designed to contact the piston 31 with a constraining force effective to prevent the motion of the first plate 30 until the constraining force is removed. The brake linings 46 therefore supports and holds the first plate 30 relative to the reference frame 32. When contact between the brake linings 46 and the first plate 30 is removed, the piston 31 may be displaced vertically with respect to the reference frame 32.

The elastic element 42 serves as a return spring that tends to restore the first plate 30 to its original position when the brake linings 46 are disengaged and the paraffin actuator is un-activated. The elastic element can be a coil spring manufactured from a shape memory alloy, stainless steel, or other alloys, and has a spring constant effective to displace the first plate against the hydrostatic pressure of the paraffin fluid. One or more optional supplementary actuators (e.g., a first supplementary actuator 50 and/or a second supplementary actuator 52) may be used to assist the paraffin in displacing the first plate 30 with respect to the reference frame 32.

As can be seen in the FIG. 7, the reference frame has a geometry effective to contain the actuator 34. The actuator 34 comprises the paraffin bath 44, the elastic element 42, the optional support element 48, the brake lining 46 and any optional supplementary actuators 50 and/or 52.

In one embodiment, in one method of operating the programmable shim 28 disclosed in the FIG. 7, the paraffin is activated by heating it. Heating elements (not shown) that use resistive heating can be used to heat the paraffin thereby causing a large change in its volume. This expansion is constrained within the reference frame 32 and causes a rise in the pressure of the liquid paraffin, which acts on the piston 31 and the inner walls of the reference frame 32. The pressure on the piston 31 facilitates the vertical displacement of piston 31 and the first plate 30, while the pressure on the inner walls of the reference frame 32 tends to displace the brake linings 46 away from the piston 31.

The combination of these two forces allows the first plate 30 to move vertically upwards in a controlled manner. Once a new desired position is reached, the paraffin is cooled down, thereby re-engaging the brake linings 46 with the piston 31. This re-engagement of the brake linings 46 with the piston 31 facilitates the maintenance of the new position of the first plate 30. The cooling of the paraffin may be accomplished by convection cooling, or the like.

Additional control over the displacement of the programmable shim 28 can be obtained if one or more supplementary actuators (e.g., a first supplementary actuator 50 and/or a second supplementary actuator 52) are used to disengage the brakes instead of relying on the internal pressure obtained by the expansion of the paraffin. For example, the first supplementary actuator 50 can be a piezo-ceramic element that can be driven into a shear deformation mode while the second supplementary actuator 52 is a pre-strained shape memory alloy element that can be contracted on the application of a suitable electrical signal. Both these actuators deform the walls of the reference frame 32 such that the brake linings 46 which are in contact with the piston 31 are disengaged from them. Disengaging the brake linings 46 without activating the paraffin, allows the first plate 31 to be moved downwards in a controlled manner, thereby enabling bi-directional operation for the programmable shim 28.

Example 3

In this example, the High Output Paraffin (HOP) actuator-based programmable shim 28 described above can also be implemented using a magnetorheological fluid and/or an electrorheological fluid brake instead of (or in addition to) the brake linings.

Figure 8:
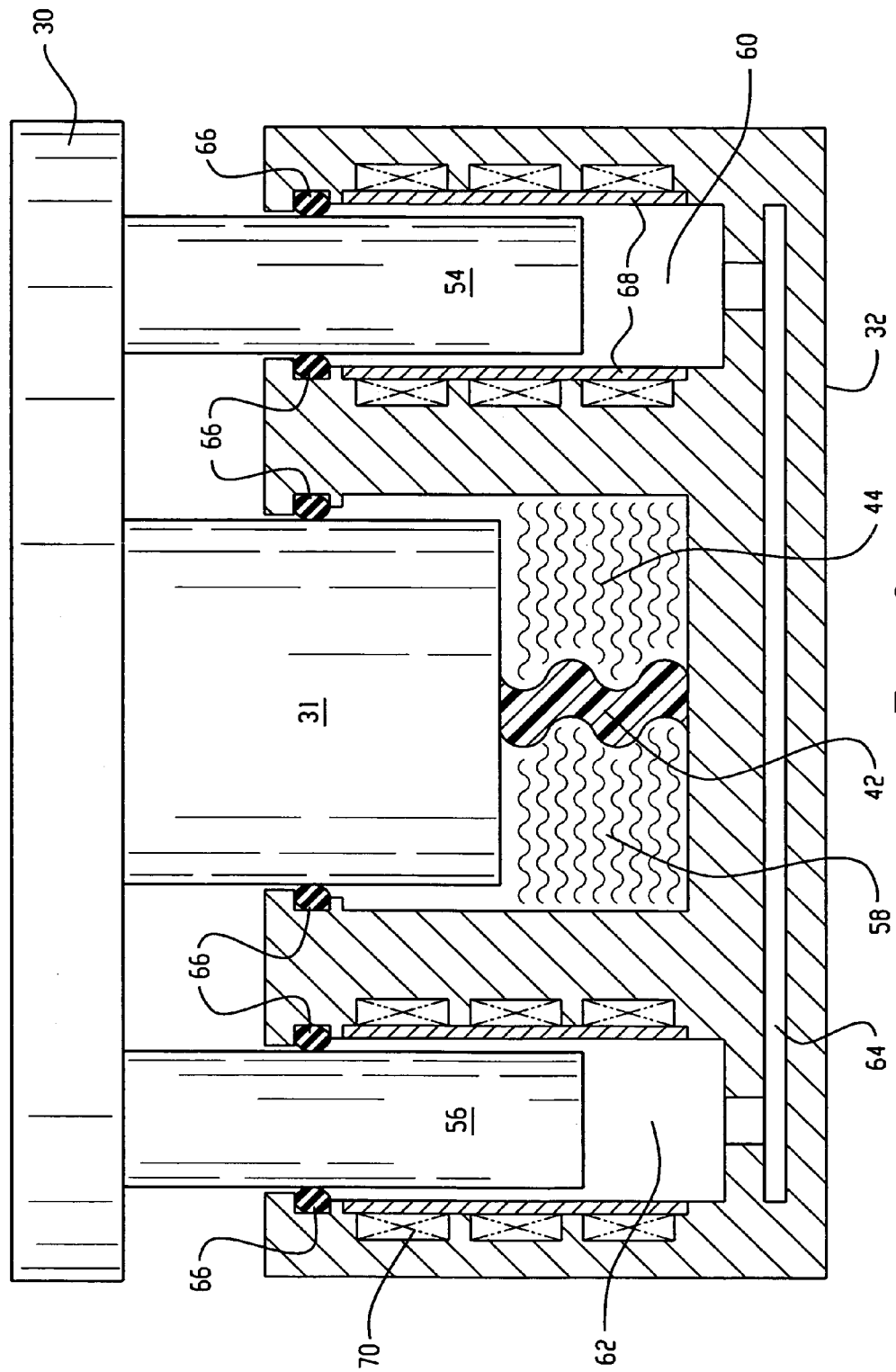
FIG. 8 is a schematic depicting an exemplary embodiment of a programmable shim enjoying a magnetorheological or electrorheological fluid in addition to employing thermal expansion or phase changes between the solid, liquid, and gaseous phases.

FIG. 8 is an exemplary depiction of the mechanism employed in the programmable shim 28. The first plate 30 comprises a main piston 31 and side pistons 54, 56. The reference frame 32 therefore serves as a housing for the main port 58 and the side ports 60, 62. The main piston 31 is in slideable communication with the main port 58, which contains paraffin fluid. As noted above, in the Example 2, heating of the paraffin fluid in the main port, exerts an upward vertical pressure on the first plate 30. This pressure facilitates the displacement of the first plate 30 with respect to the reference frame 32 when all constraints imposed upon the first plate 30 have been removed.

The side pistons 54, 56 are in slideable communication with the side ports 60, 62, which contain a magnetorheological fluid. In one embodiment, the side ports can be filled with an electrorheological fluid if desired.

The magnetorheological fluid is drawn from a pressurized sump 64 disposed within the reference frame 32 and is prevented from escaping out of the ports by seals 66. Suitable examples of the seals 66 are O-rings. The ports 60, 62 are surrounded by one or more permanent magnets 68, which produce a first biasing field (not shown) on the magnetorheological fluid. One or more electromagnetic coils 70 are wound around the permanent magnets such that, when an electrical current is passed through the coils 70 they produce a second biasing field that acts in opposition to the first biasing field.

The first biasing field increases the shear strength of the magnetorheological fluid, which then acts as a normally-engaged brake by preventing the displacement of the first plate 30 position relative to the reference frame 32. The term "normally-engaged" in reference to a brake or a braking force as used herein indicates that the brake is activated and resists relative motion of a component of the programmable shim 28 that it is in contact with The increase in the shear strength of the magnetorheological fluid inhibits the relative motion between the first plate 30 and the reference frame 32. Activation of the electromagnet coils 70 serves to disengage the brake by counteracting the influence of the first biasing field. The disengagement of the braking action produced by the permanent magnet can also be accomplished manually by changing some part of the magnetic circuit e.g., by turning a knob on the shim. This may be used as the primary or as a redundant backup (i.e. manual override) brake disengagement mechanism.

Whenever it is desired to change the position of the first plate 30 with respect to the reference frame 32, the second biasing field is activated. As noted in Example 2, the heating of the paraffin oil facilitates a change in the vertical position of the first plate 30 with respect to the reference frame 32. When the paraffin oil contained in the main port is heated, the first plate 30 is displaced vertically upwards and away from the reference frame 32. Thus by simultaneously activating the second biasing field and heating the paraffin oil, displacement of the first plate 30 with respect to the reference frame 32 can occur.

Once the desired new position of the first plate 30 is achieved, the second biasing field provided by the electromagnets is switched off and the permanent magnet induced field is restored thereby providing the braking force that is effective for maintaining the first plate 30 in its new position. In one embodiment, electrical circuitry (not shown) that permits reversing the flow of current through the electromagnets can be used to further increase the holding power (up to the limit imposed by the yield strength of the magnetorheological fluid) of the programmable shim 28.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A shim for positioning a work piece comprising:
   a first plate attachable to said workpiece;
   a reference frame;
   an actuator in operative communication with the first plate and the reference frame;
   wherein the actuator is selectively actuated by a first active material and wherein the first active material is at least one of a shape memory alloy, a ferromagnetic shape memory alloy, a shape memory polymer, an electroactive polymer, a piezoelectric material, a magnetostrictive material, an electrorheological fluid, a magnetorheological fluid, a magnetorheological elastomer, or a paraffin-based material;
   wherein the first plate upon actuation by the actuator is displaceable with respect to the reference frame into a set position;
   wherein the first plate is held in the set position by the actuator without assistance of power;
   wherein said shim is configured to position a load of about 0.5 kilograms to 10,000 kilograms;
   wherein the actuator further comprises a second active material to perform the holding of the first plate in the set position without assistance of power, the second active material being different from the first active material; and
   wherein the second active material is at least one of a shape memory alloy, a ferromagnetic shape memory alloy, a shape memory polymer, an electroactive polymer, a piezoelectric material, a magnetostrictive material, an electrorheological fluid, a magnetorheological fluid, a magnetorheological elastomer, or a paraffin-based material.

2. The shim of claim 1, wherein the first active material has the ability to return to an original defined shape upon application of an external stimulus.

3. The shim of claim 1, wherein the first active material undergoes a change in at least one of stiffness and shape in proportion to the strength of an external stimulus.

4. The shim of claim 1, wherein the reference frame partially or completely surrounds the first plate and wherein the first plate upon actuation by the actuator can be displaced vertically, horizontally and/or rotationally with respect to the reference frame.

5. The shim of claim 1, wherein the first active material can change at least one of its shear strength, modulus properties, and shape to control the position of the first plate with respect to the reference frame.

6. The shim of claim 1, wherein the actuator employs control logic and/or a feedback loop to adjust the position of the shim;
   wherein the workpiece generates a force pattern reflecting the position of the workpiece; and
   wherein the shim is in operative communication with a sensor that detects the force pattern of the workpiece, to allow the shim to adjust the position of the workpiece.

7. The shim of claim 1, wherein the actuator comprises an electric stepper motor, an inchworm, a piezoelectric inchworm, an ultrasonic motor, an electrohydrostatic actuator, a nanomotion piezoelectric motor, a compact hybrid actuator device, or combinations thereof.

8. The shim of claim 7, wherein the electric stepper motor, the inchworm, a piezoelectric inchworm, the ultrasonic motor, the electrohydrostatic actuator, a nanomotion piezoelectric motor, and the compact hybrid actuator device comprise an active material.

9. The shim of claim 1, further comprising a second plate and/or a third plate, wherein the second and/or third plates are in operative communication with the actuator.

10. The shim of claim 9, wherein the second plate and/or the third plate are adopted to act cooperatively and synchronously with a first plate.

11. A method of aligning a work piece comprising:
disposing the work piece upon a first plate of a shim;
activating a first active material within an actuator with an external stimulus; wherein the actuator is in operative communication with the first plate to displace the work piece;
wherein the first active material is at least one of a shape memory alloy, a ferromagnetic shape memory alloy, a shape memory polymer, an electroactive polymer, a piezoelectric material, a magnetostrictive material, an electrorheological fluid, a magnetorheological fluid, a magnetorheological elastomer, or a paraffin-based material;
wherein the work piece is displaceable vertically, horizontally, and rotationally with respect to a reference frame into a set position;
holding said work piece in said set position with a second active material, the second active material being different from the first active material;
wherein said shim is configured to position a load of about 0.5 kilograms to 10,000 kilograms; and
wherein the second active material is at least one of a shape memory alloy, a ferromagnetic shape memory alloy, a shape memory polymer, an electroactive polymer, a piezoelectric material, a magnetostrictive material, an electrorheological fluid, a magnetorheological fluid, a magnetorheological elastomer, or a paraffin-based material.

12. The method of claim 11, further comprising holding the work piece in a displaced position without the assistance of power.

13. The method of claim 11, wherein the work piece is reversibly displaced with respect to a reference frame.

14. The method of claim 11, wherein the actuating comprises applying an external stimulus to the actuator, and wherein the external stimulus is thermal, electric, magnetic, radiation, chemical, or a combination comprising at least one of the foregoing external stimuli.

15. The method of claim 11, wherein the shim displaces the work piece to a distance of less than or equal to about 50 micrometers from a specified reference point.

16. The shim of claim 1, wherein the actuator further comprises:
a shell at least partially surrounding the second active material,
the second active material in a longitudinal bundle that is affixed to an inner surface of the shell, and
the first active material in a matrix surrounding the shell and the second active material;
wherein an external stimulus to the first active material deforms the shell and displaces the first plate from an original position into the set position;
wherein the second active material is configured to be heated while the set position of the first plate is established by the external stimulus to the first active material; and
wherein the second active material is configured to be cooled to hold the first plate in the set position once established.

17. The shim of claim 16, wherein:
the first active material is a shape memory alloy; and
the second active material is a shape memory polymer.

18. The shim of claim 16, further comprising a structural member in contact with the shell and the second active material, configured to control the stiffness distribution of the shim.

19. The shim of claim 1, further comprising:
a piston in contact with the first plate and the first active material;
a brake lining engageable between the piston and the reference frame, that prevents the movement of the first plate when the brake lining is engaged;
wherein the first active material is a paraffin-based material that expands on heating to disengage the brake lining from the piston and displace the first plate from an original position into the set position;
wherein the paraffin-based material is configured to be cooled once the set position is reached, thereby engaging the brake lining to hold the first plate in the set position; and
an elastic element to restore the first plate to the original position when the brake lining is disengaged.

20. The shim of claim 19, further comprising at least one supplementary actuator configured to disengage the brake lining from the piston by deforming at least one wall of the reference frame; and
wherein the supplementary actuator disengages the brake lining without heating the paraffin-based material.

21. The shim of claim 1, further comprising:
a main piston in contact with the first plate and the first active material;
a second active material in contact with the first plate and at least one side piston;
wherein the first active material is a paraffin-based material that expands on heating to displace the first plate from an original position into the set position, wherein the paraffin-based material is cooled once the set position is reached;
wherein the second active material can be activated in response to a first external stimulus to hold the first plate in the set position with respect to the reference frame;
wherein the second active material can be un-activated in response to a second external stimulus to allow the movement of the first plate with respect to the reference frame;
an elastic element to restore the first plate to the original position when the second active material is un-activated; and
wherein the reference frame at least partially surrounds the main piston and the side piston.

22. The shim of claim 21, wherein:
the second active material is a magnetorheological fluid; and
the second active material is activated and un-activated through a change in at least one of its shear strength, modulus properties, and shape.

23. The shim of claim 21, wherein:
the second active material is an electrorheological fluid; and
the second active material is activated and un-activated through a change in at least one of its shear strength, modulus properties, and shape.

* * * * *